United States Patent
Kim et al.

(10) Patent No.: US 12,129,943 B2
(45) Date of Patent: Oct. 29, 2024

(54) NIPPLE ASSEMBLY

(71) Applicants: Hyundai Motor Company, Seoul (KR); Kia Corporation, Seoul (KR)

(72) Inventors: Yun Ho Kim, Seoul (KR); Jae Hoon Yoon, Gwacheon-si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 71 days.

(21) Appl. No.: 17/832,206

(22) Filed: Jun. 3, 2022

(65) Prior Publication Data

US 2023/0008523 A1 Jan. 12, 2023

(30) Foreign Application Priority Data

Jul. 6, 2021 (KR) .................. 10-2021-0088698

(51) Int. Cl.
*F16L 21/02* (2006.01)
*F16L 41/08* (2006.01)
*F28F 9/02* (2006.01)
*H05K 7/20* (2006.01)

(52) U.S. Cl.
CPC .......... *F16L 21/022* (2013.01); *F16L 41/088* (2013.01); *F28F 9/0248* (2013.01); *H05K 7/20927* (2013.01)

(58) Field of Classification Search
CPC ......... F16L 21/022; F16L 5/02; F16L 41/086; F16L 17/02; H05K 7/20927; H05K 7/20272; F28F 9/0248
See application file for complete search history.

(56) References Cited

U.S. PATENT DOCUMENTS

| | | | | |
|---|---|---|---|---|
| 2,812,959 | A | * | 11/1957 | Fuller .................. F16L 23/024 285/137.11 |
| 5,197,766 | A | * | 3/1993 | Glover .................. F16L 23/167 285/368 |
| 2014/0300105 | A1 | * | 10/2014 | Kalbacher .............. F16L 39/00 285/351 |
| 2017/0066344 | A1 | | 3/2017 | Ishikawa |
| 2018/0187814 | A1 | | 7/2018 | Laule et al. |

(Continued)

FOREIGN PATENT DOCUMENTS

DE 102013215864 2/2015
EP 3627085 3/2020

(Continued)

*Primary Examiner* — James M Hewitt, II
(74) *Attorney, Agent, or Firm* — Morgan, Lewis & Bockius LLP

(57) ABSTRACT

A nipple assembly includes nipple bodies configured so that one end portion of each of the nipple bodies is inserted into a housing so as to be coupled to a cooling medium inlet or a cooling medium outlet of a heat exchanger and a remaining end portion of each of the nipple bodies protrudes outwards from the housing, at least one first sealing unit sealing a gap between the one end portion of each of the nipple bodies and the cooling medium inlet or the cooling medium outlet, a flange portion formed at a position between two end portions of each of the nipple bodies to be coupled to the housing, and a second sealing unit including a first sealing portion sealing a gap between the flange portion and the housing and a second sealing portion configured to extend from the first sealing portion.

13 Claims, 6 Drawing Sheets

(56) References Cited

U.S. PATENT DOCUMENTS

2022/0221084 A1\* 7/2022 Huang ................ F16L 41/086
2022/0349662 A1\* 11/2022 Gwon .................. F28F 9/0258

FOREIGN PATENT DOCUMENTS

| EP | 3798491 | 3/2021 |
|----|---------|--------|
| JP | 2017-103983 | 6/2017 |
| KR | 10-0666799 B1 | 1/2007 |
| WO | WO 2015/001408 | 1/2015 |

\* cited by examiner

NIPPLE ASSEMBLY

CROSS-REFERENCE TO RELATED APPLICATION

The present application claims priority to Korean Patent Application No. 10-2021-0088698, filed on Jul. 6, 2021, the entire contents of which is incorporated herein for all purposes by this reference.

BACKGROUND OF THE PRESENT DISCLOSURE

Field of the Present Disclosure

The present disclosure relates to a nipple assembly which is a connection pipe connected to a pipe or a hose, and more particularly, to a nipple assembly which may discharge a cooling medium to the outside of a power conversion apparatus (an inverter) of a vehicle even when the cooling medium leaks due to breakage of a watertight structure (a sealing unit) between a heat exchanger provided in the housing of the power conversion apparatus and configured to cool the power conversion apparatus and a nipple.

Description of Related Art

FIG. 1 illustrates a power conversion apparatus 1000 used in a hybrid electric vehicle or an electric vehicle. The power conversion apparatus 1000 receives power supplied from a power supply, converts the voltage and frequency of the power, and then supplies the converted power to a motor to control effective use of the speed of the motor.

The power conversion apparatus 1000 generates heat due to heating elements provided therein when being operated, and thus, a heat exchanger configured to cool the power conversion apparatus 1000 is provided in a housing 10 of the power conversion apparatus 1000 or a flow path in which a cooling medium flows is directly provided in the housing 10 to cool the power conversion apparatus 1000.

FIG. 2 illustrates a heat exchanger 900 provided in the housing 10 of the power conversion apparatus 1000.

As shown in FIG. 1 and FIG. 2, the heat exchanger 900 receives the cooling medium (coolant or the like) for cooling the power conversion apparatus 1000 through a nipple 100. The nipple 100 corresponds to a connection unit configured to transmit the cooling medium to the heat exchanger 900 provided in the housing 10 of the power conversion apparatus 1000, and the nipple 100 may have various shapes depending on whether or not the nipple 100 interferes with other parts in the vehicle.

Furthermore, the power conversion apparatus 1000 is formed in a sealed structure (a watertight structure or an airtight structure) to minimize influence of external environments to achieve electrical isolation. A sealing member, such as a gasket, is used to form the sealed structure, and in general, heat exchangers are formed of a metal having excellent thermal conductivity and nipples are formed of plastic. The two materials have different coefficients of thermal expansion, and may thus cause assembly failure and breakage of the sealed structure at a cooling medium inlet or a cooling medium outlet of the heat exchanger 900 connected to the nipple 100, as shown in FIG. 3. When the sealed structure is broken, the cooling medium may leak to the inside of the power conversion apparatus 1000, and particularly, the cooling medium, which has been heated, comes into contact with the cooling medium outlet 13 and the cooling medium flows toward the body of the nipple 100 at the cooling medium outlet 13, and thus, the sealed structure may frequently be broken at the cooling medium outlet 13. When the cooling medium leaks to the inside of the power conversion apparatus 100, the vehicle may be turned off through control logic, or, if the control logic is not operated, high voltage may be generated and thus cause a fire, i.e., cause a disaster, causing a safety issue.

To solve the present problem, a nipple assembly, which may minimize leakage of the cooling medium to the inside of the power conversion apparatus 1000 even when the seal between the cooling medium inlet 12 or the cooling medium outlet 13 of the heat exchanger 900 and the nipple 100 has failed, is required.

The information included in this Background of the present disclosure section is for enhancement of understanding of the general background of the present disclosure.

BRIEF SUMMARY

Various aspects of the present disclosure are directed to providing a nipple assembly including nipple bodies configured so that one end portion of each of the nipple bodies is inserted into a housing so as to be coupled to a cooling medium inlet or a cooling medium outlet of a heat exchanger and a remaining end portion of each of the nipple bodies protrudes outwards from the housing so that a cooling medium is circulated into the heat exchanger, at least one first sealing unit sealing a gap between the one end portion of each of the nipple bodies and the cooling medium inlet or the cooling medium outlet of the heat exchanger, a flange portion formed at a position between two end portions of each of the nipple bodies to be coupled to the housing, and a second sealing unit including a first sealing portion sealing a gap between the flange portion and the housing and a second sealing portion extending from the first sealing portion and sealing a gap between an end portion of the cooling medium inlet or the cooling medium outlet of the heat exchanger and a corresponding one of the nipple bodies.

In accordance with various aspects of the present disclosure, the above and other objects may be accomplished by the provision of a nipple assembly including nipple bodies configured so that one end portion of each of the nipple bodies is inserted into a housing so as to be coupled to a cooling medium inlet or a cooling medium outlet of a heat exchanger and a remaining end portion of each of the nipple bodies protrudes outwards from the housing so that a cooling medium is circulated into the heat exchanger, at least one first sealing unit sealing a gap between the one end portion of each of the nipple bodies and the cooling medium inlet or the cooling medium outlet of the heat exchanger, a flange portion formed at a position between two end portions of each of the nipple bodies to be coupled to the housing, and a second sealing unit including a first sealing portion sealing a gap between the flange portion and the housing and a second sealing portion extending from the first sealing portion and sealing a gap between an end portion of the cooling medium inlet or the cooling medium outlet of the heat exchanger and a corresponding one of the nipple bodies.

The housing may be configured to cover and seal a power conversion apparatus of a vehicle, the heat exchanger configured to cool the power conversion apparatus may be provided in the housing, the heat exchanger may be provided with the cooling medium inlet and the cooling medium outlet, and the nipple bodies may be provided in a pair to be connected to the cooling medium inlet and the cooling medium outlet of the heat exchanger, respectively.

Each of the nipple bodies may be connected to a corresponding one of the cooling medium inlet and the cooling medium outlet of the heat exchanger, the at least one sealing unit may be provided between the cooling medium inlet of the heat exchanger and a corresponding one of the nipple bodies, and the at least one sealing unit and the second sealing portion of the second sealing unit may be provided between the cooling medium outlet of the heat exchanger and a remaining one of the nipple bodies.

Each of the nipple bodies may be inserted into a corresponding one of the cooling medium inlet and the cooling medium outlet of the heat exchanger, and the at least one sealing unit and the second sealing portion of the second sealing unit may be provided between the cooling medium inlet or the cooling medium outlet of the heat exchanger and a corresponding one of the nipple bodies.

A sealing groove may be formed at one end portion of each of the nipple bodies along an external circumference thereof, the at least one first sealing unit may be accommodated in the sealing groove, a separation space may be formed between a position of each of the nipple bodies spaced from the sealing groove in an outward direction of the housing and a corresponding one of the cooling medium inlet and the cooling medium outlet of the heat exchanger, and the second sealing portion of the second sealing unit may be disposed in the separation space.

An expansion portion may be formed at an end portion of each of the cooling medium inlet and the cooling medium outlet of the heat exchanger, a separation space may be formed between the expansion portion and a corresponding one of the nipple bodies, and the second sealing portion may fill the separation space.

At least one drainage channel may be formed in each of the nipple bodies in a direction of extension of the nipple bodies, one end portion of the at least one drainage channel may be connected to a space between the at least one first sealing unit and the second sealing unit, and a remaining end portion of the at least one drainage channel may be connected outside the housing.

The at least one drainage channel may be formed at a position located at a lower portion of a side surface of each of the nipple bodies in a direction of gravity.

The at least one drainage channel may include a plurality of drainage channels formed in a direction of extension of each of the nipple bodies to be spaced from each other along a circumference of each of the nipple bodies.

A flow groove may be formed at a position of an external surface of each of the nipple bodies between the at least one first sealing unit and the second sealing unit along a circumference of each of the nipple bodies, one end portion of the at least one drainage channel may be connected to the flow groove, and the cooling medium may be guided to the at least one drainage channel through the flow groove.

The flange portion may be formed in a shape configured to extend from the position between the two end portions of each of the nipple bodies outside the housing along an external surface of the housing.

At least one drainage channel may be formed in each of the nipple bodies in a direction of extension of each of the nipple bodies, one end portion of the at least one drainage channel may be connected to a space between the at least one first sealing unit and the second sealing unit, and a remaining end portion of the at least one drainage channel may pass through the flange portion and be connected outside the housing.

A sealing space may be formed between the flange portion and an external surface of the housing, and the first sealing portion of the second sealing unit may be located in the sealing space.

The second sealing portion may have a shape of a tube configured to surround each of the nipple bodies, and the first sealing portion may have an annular shape configured to extend from one end portion of the second sealing portion in a radial direction thereof.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
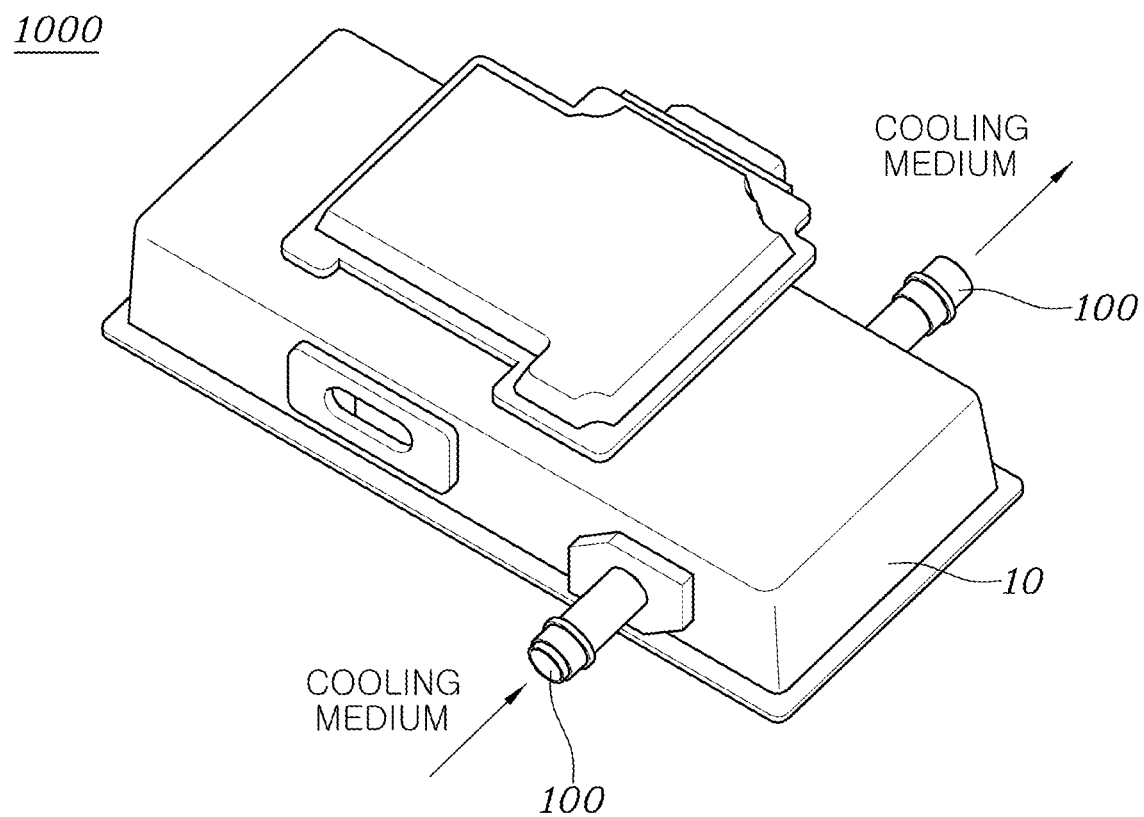
FIG. 1 is a perspective view exemplarily illustrating a power conversion apparatus used inside a vehicle.
Figure 2:
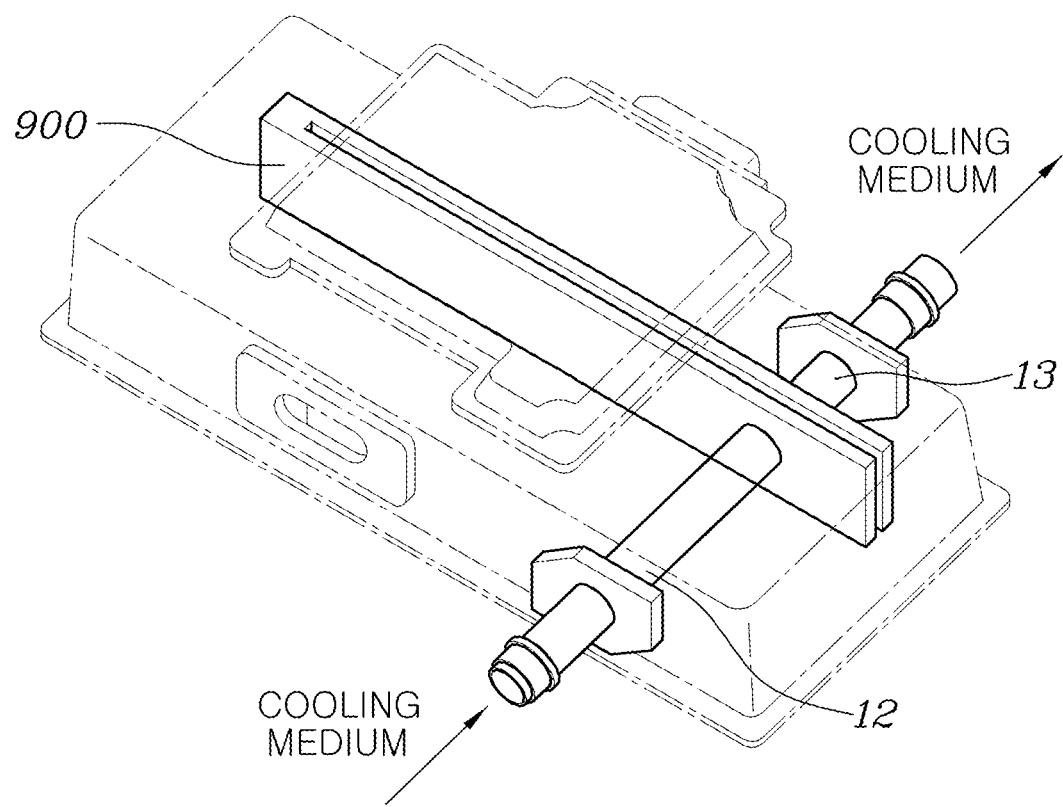
FIG. 2 is a perspective view exemplarily illustrating a heat exchanger provided in the power conversion apparatus.
Figure 3:
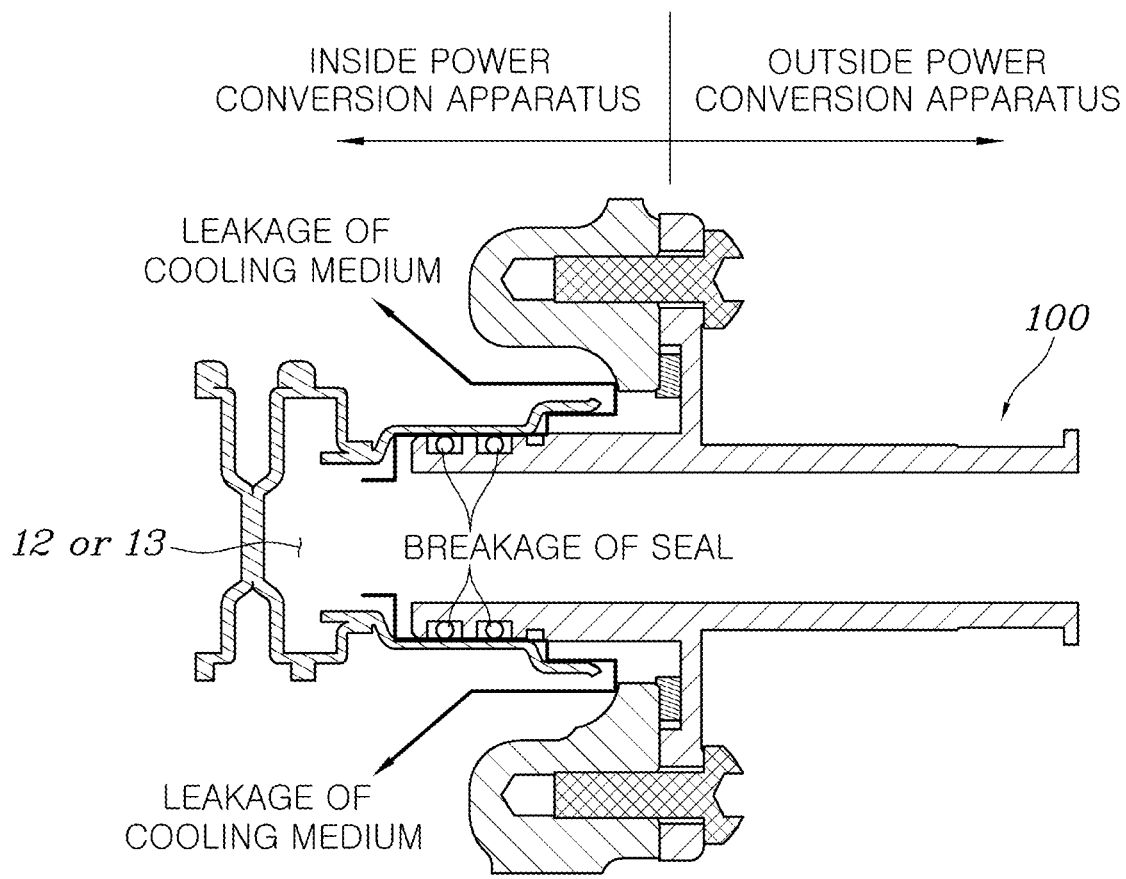
FIG. 3 is a cross-sectional view exemplarily illustrating connection between a cooling medium inlet or a cooling medium outlet of a heat exchanger and a nipple in a conventional power conversion apparatus.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter reference will now be made in detail to the exemplary embodiments of the present disclosure, examples of which are illustrated in the accompanying drawings. In the following description of the present disclosure, a detailed description of known functions and configurations incorporated herein will be omitted when it may make the subject matter of the present disclosure rather unclear. While the present disclosure will be described in conjunction with exemplary embodiments of the present disclosure, it will be understood that the present description is not intended to limit the present disclosure to the exemplary embodiments of the present disclosure. On the other hand, the present disclosure is directed to cover not only the exemplary embodiments of the present disclosure, but also various alternatives, modifications, equivalents and other embodiments, which may be within the spirit and scope of the present disclosure as defined by the appended claims.

Figure 4:
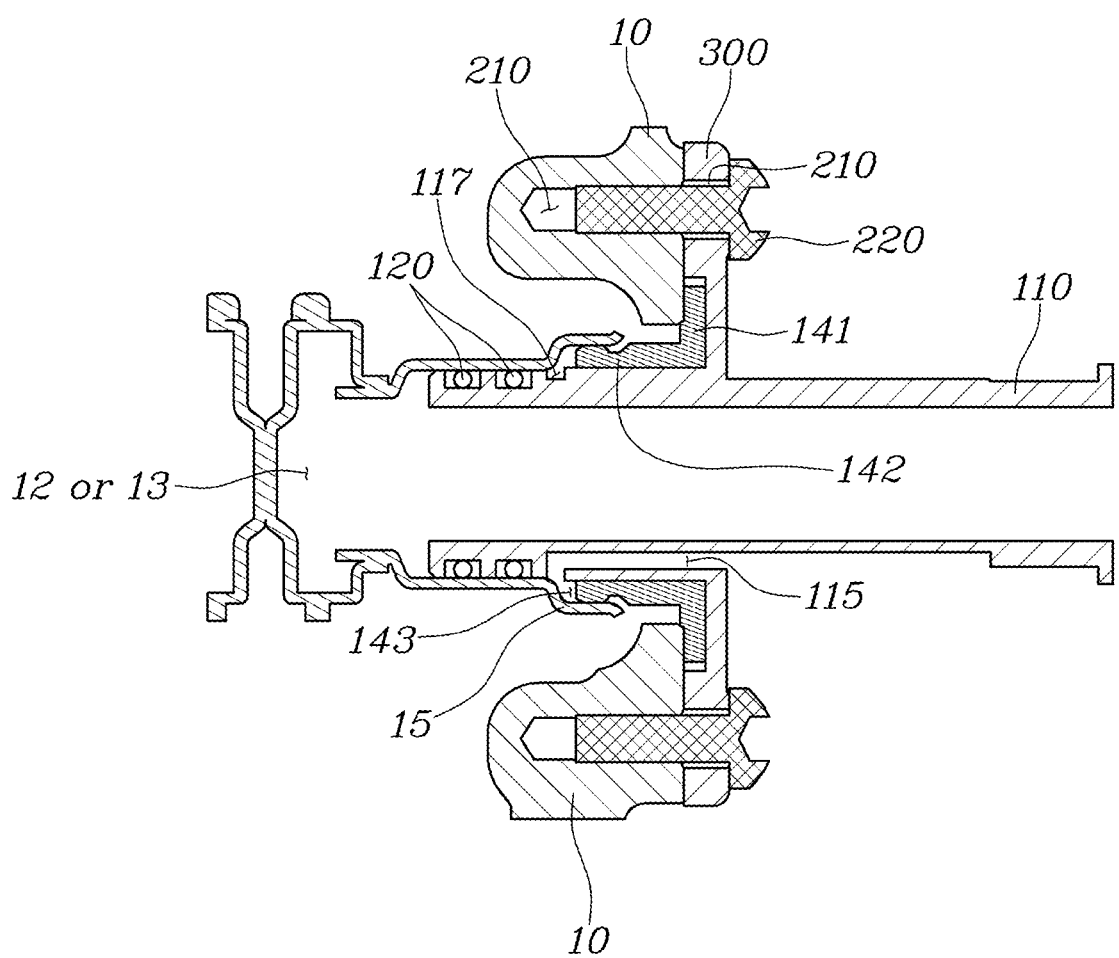
FIG. 4 is a cross-sectional view exemplarily illustrating connection between a cooling medium inlet or a cooling medium outlet of a heat exchanger and a nipple assembly according to an exemplary embodiment of the present disclosure.
Figure 5:
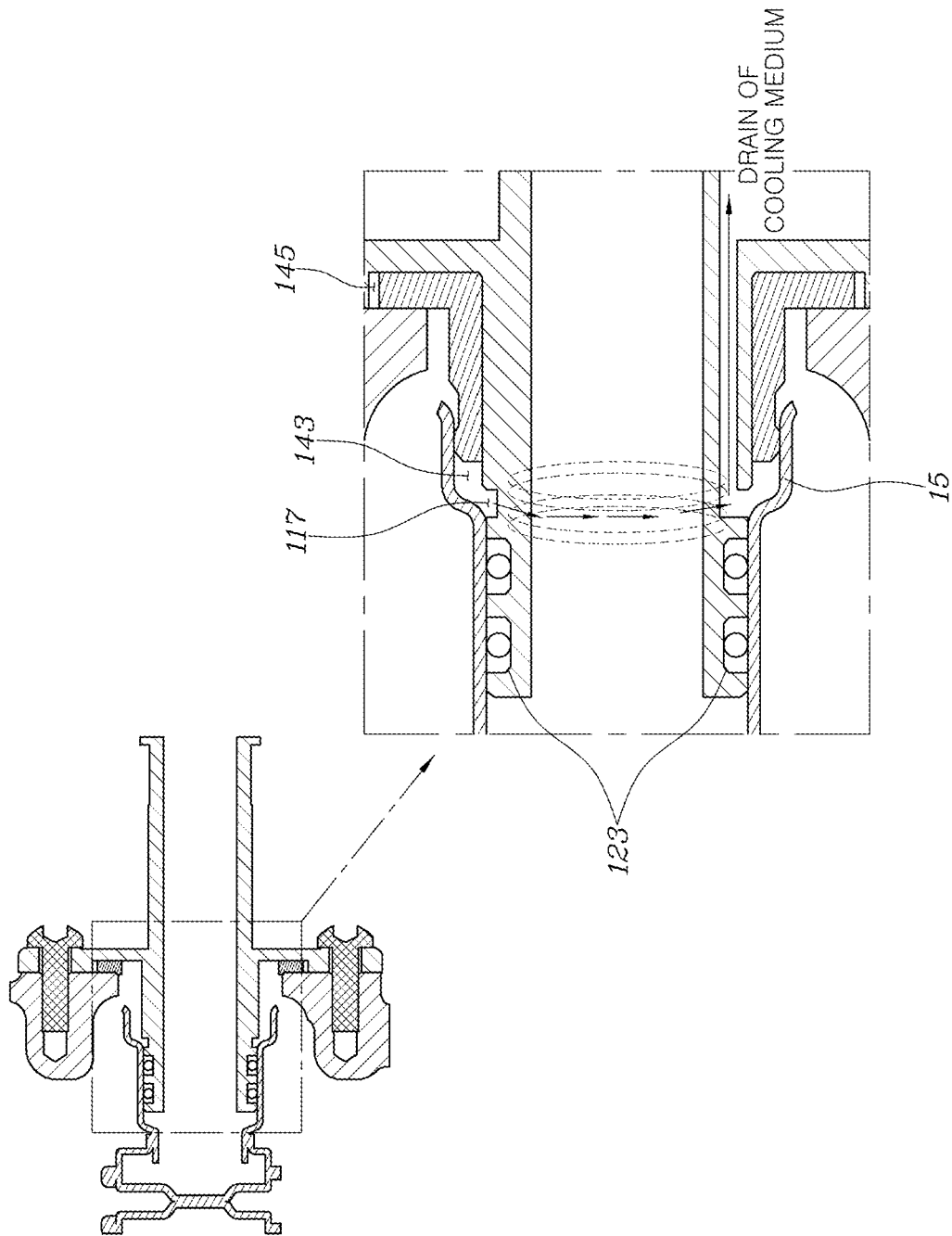
FIG. 5 is an enlarged cross-sectional view exemplarily illustrating connection between the cooling medium inlet or the cooling medium outlet of the heat exchanger and the nipple assembly according to an exemplary embodiment of the present disclosure.
Figure 6:
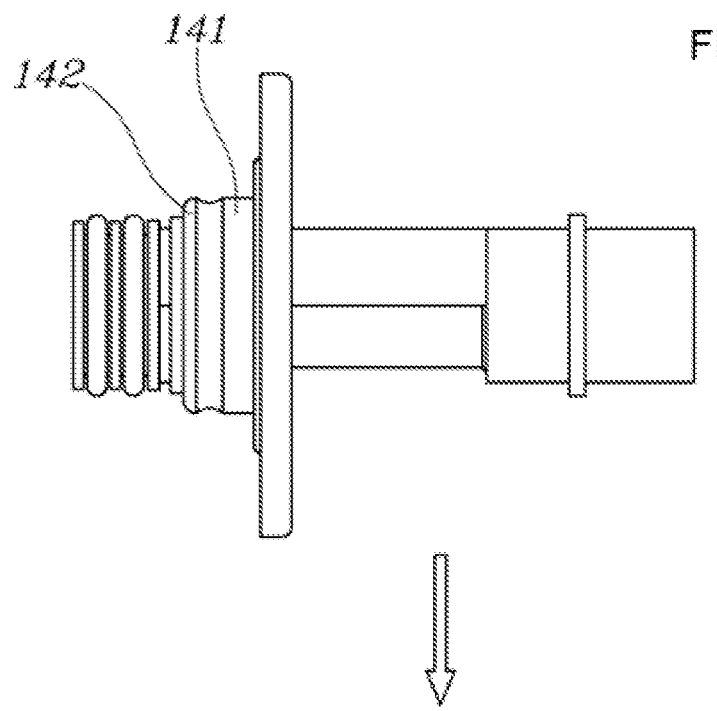
FIG. 6A and FIG. 6B are side and front views of a nipple body provided with a drainage channel formed therein.
Figure 6:
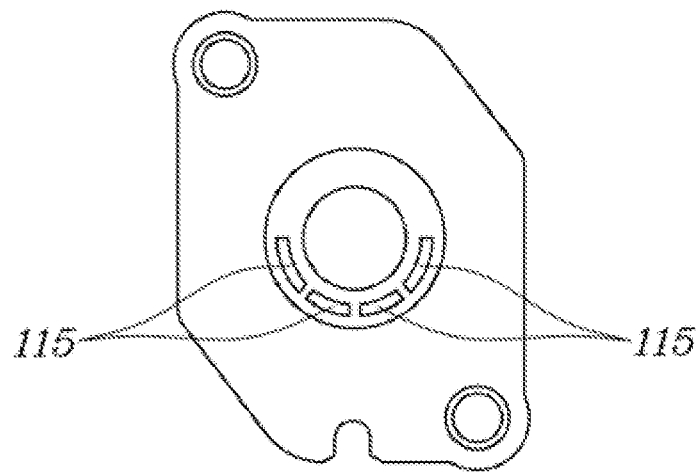

As described above, the present disclosure is characterized in that inflow of a cooling medium into a power conversion apparatus 1000 may be minimized only by changing the shapes of the sealing units and the nipple body of the conventional nipple assembly and the leaked cooling medium may be guided to the outside of the housing 100. The present disclosure may be applied to any field to which connection units of fluid, such as a nipple, are applied, in addition to power conversion apparatuses for vehicles. The present disclosure will be described in detail with reference to FIG. 4, FIG. 5 and FIG. 6.

A nipple assembly according to various exemplary embodiments of the present disclosure includes nipple bodies 110 configured so that one end portion of each of the nipple bodies 110 is inserted into a housing 10 to be coupled to a cooling medium inlet 12 or a cooling medium outlet 13 of a heat exchanger and a remaining end portion of each of the nipple bodies 110 protrudes outwards from the housing 10 so that a cooling medium is circulated into the heat exchanger, first sealing units 120 configured to seal a gap between one end portion of each of the nipple bodies 110 and the cooling medium inlet 12 or the cooling medium outlet 13 of the heat exchanger, a flange portion 300 formed at a position between the two end portions of each of the nipple bodies 110 to be coupled to the housing 10, and a second sealing unit including a first sealing portion 141 configured to seal a gap between the flange portion 300 and the housing 10 and a second sealing portion 142 configured to extend from the first sealing portion 141 to seal a gap between the end portion of the cooling medium inlet 12 or the cooling medium outlet 13 of the heat exchanger and a corresponding one of the nipple bodies 110.

In more detail, the cooling medium flows into the heat exchanger and is heated through heat exchange with the power conversion apparatus 1000, and the heated cooling medium is discharged to the outside of the heat exchanger. The nipple body 110 is coupled to the cooling medium inlet 12 or the cooling medium outlet 13 or the heat exchanger. The first sealing units 120 configured to primarily seal the cooling medium inlet 12 or the cooling medium outlet 13 are provided at one end portion of the nipple body 110. The first sealing units 120 are accommodated in sealing grooves 123 provided at the end portion of the nipple body 110, and one first sealing unit 120 or a plurality of first sealing units 120 may be provided. The first sealing units 120 may be O-rings, and may be inserted into the sealing grooves 123 provided at one end portion of the nipple body 110. The first sealing units 120 may prevent the cooling medium from leaking through surface-contact with the cooling medium inlet 12 or the cooling medium outlet 13 of the heat exchanger.

The flange portion 300 configured to couple the housing 10 and the nipple body 110 to each other may be formed between both end portions, i.e., one end portion and the other end portion, of the nipple body 110, coupling holes 210 may be formed in one side of the flange portion 300 and one surface of the housing 10 to correspond to each other, and the nipple body 110 and the housing 10 may be coupled to each other by facilitating coupling protrusions 220 to pass through the coupling holes 210. Here, the coupling holes 210 may be provided in plural to achieve stable coupling between the nipple body 110 and the housing 10.

The power conversion apparatus 1000 is formed in a sealed structure to maintain a constant internal environment, and the first sealing units 120 are formed in a watertight structure for preventing the cooling medium from leaking. However, it is necessary to additionally form an airtight structure for preventing water vapor in the gaseous phase from flowing into the nipple assembly from the outside, and for the present purpose, the airtight structure is formed by sealing a gap between the flange portion 300 and the housing 100. In more detail, the first sealing portion 141 of the second sealing unit is located in a sealing space 145 between the flange portion 300 and the housing 10, forming the airtight structure. The second sealing unit is configured so that the second sealing portion 142 extending from the first sealing portion 141 seals a gap between the end portion of the cooling medium inlet 12 or the cooling medium outlet 13 of the heat exchanger and the nipple body 110. In more detail, a separation space 143 may be formed between the nipple body 110 and the cooling medium inlet 12 or the cooling medium outlet 13 of the heat exchanger, and the second sealing portion 142 of the second sealing unit may be disposed in the separation space 143. The second sealing unit includes the first sealing portion 141 and the second sealing portion 142, the first sealing portion 141 is configured to prevent water vapor from flowing into the nipple assembly from the outside, and the second sealing portion 142 is configured to secondarily seal the gap between the end portion of the cooling medium inlet 12 or the cooling medium outlet 13 and the nipple body 110 to prevent the cooling medium from leaking due to breakage of the seal by the first sealing units 120.

Here, the second sealing portion 142 may have a shape of a tube configured to surround the nipple body 110, and the first sealing portion 141 may have an annular shape configured to extend from one end portion of the second sealing portion 142 in the radial direction thereof. The second sealing unit may be formed separately by injection molding and thus be inserted into the nipple body 110 to be assembled with the nipple body 110, or may be formed integrally with the nipple body 110 by injection molding. Although the first sealing units 120 and the second sealing unit may be formed of the same material, the first sealing portion 141 of the second sealing unit may be formed of a material having excellent compressibility because a strong pressure is applied thereto when the housing 10 and the flange portion 300 are coupled to each other, and as circumstances demand, the first sealing portion 141 and the second sealing portion 142 of the second sealing unit may be formed of different materials.

That is, the first sealing units 120 and the second sealing portion 142 of the second sealing unit may be provided between the nipple body 110 and the cooling medium inlet 12 or the cooling medium outlet 13 of the heat exchanger and thus form watertight structures, being configured for primarily and secondarily preventing the cooling medium from leaking to the inside of the power conversion apparatus 1000.

In general, the heat exchanger and the nipple assembly are formed of aluminum and plastic, and because the two materials have different coefficients of thermal expansion, breakage of a sealed structure due to use of the power conversion apparatus 1000 frequently occurs at the cooling medium outlet 13 at which the heated cooling medium flows rather than at the cooling medium inlet 12. Therefore, to reduce manufacturing costs, the first sealing units 120 and the first sealing portion 141 of the second sealing unit may be provided at the cooling medium inlet 12 to form a watertight structure and an airtight structure, and the first sealing units 120 and the second sealing unit including the first sealing portion 141 and the second sealing portion 142 may be provided at the cooling medium outlet 13 to form a watertight structure and an airtight structure.

An expansion portion 15 is formed at the end portion of each of the cooling medium inlet 12 or the cooling medium outlet 13 of the heat exchanger, and the separation space 143 is formed between the expansion portion 15 and the nipple body 110. When the nipple body 110 and the housing 10 are coupled to each other, the second sealing portion 142 comes into surface-contact with the expansion portion 15, and elastically behaves while expanding the expansion portion 15 in designated upward and downward directions, filling the separation space 143.

The nipple body 110 of the nipple assembly according to various exemplary embodiments of the present disclosure may be provided with a drainage channel 115 configured to discharge the leaking cooling medium to the outside of the housing 10 when the watertight structure of the first sealing unit 120 is broken. The drainage channel 115 may be formed in the nipple body 110 in a direction of extension of the nipple body 110, one end portion of the drainage channel 115 may be connected to a space between the first sealing unit 120 and the second sealing unit 140, and the other end portion of the drainage channel 115 may be connected to a space outside the housing 10.

When the watertight structure of the first sealing unit 120 is broken, the cooling medium flows to the second sealing portion 142 of the second sealing unit 140. When the leaking cooling medium is gradually accumulated and thus rises to the front end portion of the second sealing portion 142, the second sealing portion 142 may lose its own sealing function due to continuous contact between the cooling medium and the second sealing portion 142. Therefore, to discharge the leaking cooling medium to the outside, the drainage channel 115 may be formed.

The drainage channel 115 may be formed at a position located at the lower portion of the side surface of the nipple body 110 in the direction of gravity, and the leaking cooling medium may naturally flow downwards to the drainage channel 115 located at the lower portion due to gravity. Because the leaking cooling medium naturally flows downwards in the direction of gravity, when the drainage channel 115 is formed at a position located at the upper portion of the side surface of the nipple body 110 in the direction of gravity, the amount of the cooling medium leaking to the outside of the housing may be small but foreign substances may flow into the nipple body 110 through the drainage channel 115 formed at the upper portion of the side surface of the nipple body 110 in the direction of gravity, and therefore, the drainage channel 115 may be formed only at the lower portion of the side surface of the nipple body 110 in the direction of gravity. Furthermore, one drainage channel 115 may be formed at the lower portion of the circumference of the nipple body 110, or a plurality of drainage channels 115 may be formed along the circumference of the nipple body 110.

The drainage channel 115 needs to be formed only at the lower portion of the nipple body 110 so that the cooling medium accumulated between the first sealing unit 120 and the second sealing unit at the upper portion of the nipple body 110 is guided to the drainage channel 115 formed at the lower portion of the nipple body 110, a flow groove 117 may be formed in the external surface of the nipple body 110 at a position between the first sealing unit 120 and the second sealing unit along the circumference of the nipple body 110, the flow groove 117 may be connected to one end portion of the drainage channel 115, and the cooling medium may be guided to the drainage channel 115 through the flow groove 117.

The flange portion 300 may be formed in a shape which extends from the position between both end portions of the nipple body 110 outside the housing 10 along the external surface of the housing 10, the drainage channel 115 may be formed in the nipple body 110 in the direction of extension of the nipple body 110, one end portion of the drainage channel 115 may be connected to the space between the first sealing unit 120 and the second sealing unit 140, and the other end portion of the drainage channel 115 may pass through the flange portion 300 and be connected to the space outside the housing 10.

Through the above-described components, inflow of the cooling medium into the power conversion apparatus 1000 may be minimized only by changing the shapes of the sealing units 120 and 140 of the nipple assembly or changing the shape of the nipple bodies 110 of the nipple assembly without adding any separate portions.

As is apparent from the above description, in a nipple assembly according to an exemplary embodiment of the present disclosure, inflow of a cooling medium into a power conversion apparatus may be minimized only by changing the shapes of sealing units of the nipple assembly or changing the shape of nipple bodies of the nipple assembly without adding any separate portions.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of predetermined exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described to explain certain principles of the present disclosure and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A nipple assembly comprising:
   nipple bodies configured so that one end portion of each of the nipple bodies is inserted into a housing to be coupled to a cooling medium inlet or a cooling medium outlet of a heat exchanger and a remaining end portion of each of the nipple bodies protrudes outwards from the housing so that a cooling medium is circulated into the heat exchanger;
   at least one first sealing unit sealing a gap between the one end portion of each of the nipple bodies and the cooling medium inlet or the cooling medium outlet of the heat exchanger;
   a flange portion formed at a position between two end portions of each of the nipple bodies to be coupled to the housing; and
   a second sealing unit including:
      a first sealing portion sealing a gap between the flange portion and the housing; and
      a second sealing portion extending from the first sealing portion and sealing a gap between an end portion of the cooling medium inlet or the cooling medium outlet of the heat exchanger and a corresponding one of the nipple bodies,
   wherein the end portion of each of the nipple bodies is inserted into an end portion of a corresponding one of the cooling medium inlet and the cooling medium outlet, and
   wherein the at least one first sealing unit and the second sealing portion of the second sealing unit are provided between the end portion of the corresponding one of the cooling medium inlet or the cooling medium outlet of the heat exchanger and an end portion of a corresponding one of the nipple bodies,
   wherein an expansion portion is formed at the end portion of each of the cooling medium inlet and the cooling medium outlet of the heat exchanger,
   wherein a separation space is formed between the expansion portion and the corresponding one of the nipple bodies, and
   wherein the second sealing portion fills the separation space.

2. The nipple assembly of claim 1,
   wherein the housing is configured to cover and seal a power conversion apparatus of a vehicle,
   wherein the heat exchanger configured to cool the power conversion apparatus is provided in the housing,
   wherein the heat exchanger is provided with the cooling medium inlet and the cooling medium outlet, and
   wherein the nipple bodies are provided in a pair to be connected to the cooling medium inlet and the cooling medium outlet of the heat exchanger, respectively.

3. The nipple assembly of claim 1,
   wherein each of the nipple bodies is connected to a corresponding one of the cooling medium inlet and the cooling medium outlet of the heat exchanger,
   wherein the at least one first sealing unit is provided between the cooling medium inlet of the heat exchanger and a corresponding one of the nipple bodies, and
   wherein the at least one first sealing unit and the second sealing portion of the second sealing unit are provided between the cooling medium outlet of the heat exchanger and a remaining one of the nipple bodies.

4. The nipple assembly of claim 1,
   wherein a sealing groove is formed at the one end portion of each of the nipple bodies along an external circumference thereof, and the at least one first sealing unit is accommodated in the sealing groove,
   wherein the separation space is formed between a position of each of the nipple bodies spaced from the sealing groove in an outward direction of the housing and a corresponding one of the cooling medium inlet and the cooling medium outlet of the heat exchanger, and
   wherein the second sealing portion of the second sealing unit is disposed in the separation space.

5. The nipple assembly of claim 1,
   wherein at least one drainage channel is formed in each of the nipple bodies in a direction of extension of the nipple bodies,
   wherein one end portion of the at least one drainage channel is connected to a space between the at least one first sealing unit and the second sealing unit, and
   wherein a remaining end portion of the at least one drainage channel is connected outside the housing.

6. The nipple assembly of claim 5, wherein the at least one drainage channel is formed in the flange portion to include a gap with an external surface of each of the nipple bodies.

7. The nipple assembly of claim 5, wherein the at least one drainage channel is formed at a position located at a lower portion of a side surface of each of the nipple bodies in a direction of gravity.

8. The nipple assembly of claim 5, wherein the at least one drainage channel includes a plurality of drainage channels formed in a direction of extension of each of the nipple bodies to be spaced from each other along a circumference of each of the nipple bodies.

9. The nipple assembly of claim 5,
   wherein a flow groove is formed at a position of an external surface of each of the nipple bodies between the at least one first sealing unit and the second sealing unit along a circumference of each of the nipple bodies,
   wherein one end portion of the at least one drainage channel is connected to the flow groove, and
   wherein the cooling medium is guided to the at least one drainage channel through the flow groove.

10. The nipple assembly of claim 1, wherein the flange portion is formed in a shape configured to extend from the position between the two end portions of each of the nipple bodies outside the housing along an external surface of the housing.

11. The nipple assembly of claim 10,
    wherein at least one drainage channel is formed in each of the nipple bodies in a direction of extension of each of the nipple bodies,
    wherein one end portion of the at least one drainage channel is connected to a space between the at least one first sealing unit and the second sealing unit, and
    wherein a remaining end portion of the at least one drainage channel passes through the flange portion and is connected outside the housing.

12. The nipple assembly of claim 1, wherein a sealing space is formed between the flange portion and an external surface of the housing, and the first sealing portion of the second sealing unit is located in the sealing space.

13. The nipple assembly of claim 1, wherein the second sealing portion has a shape of a tube configured to surround each of the nipple bodies, and the first sealing portion has an annular shape configured to extend from one end portion of the second sealing portion in a radial direction thereof.

* * * * *